(12) United States Patent
Cai et al.

(10) Patent No.: US 10,205,125 B2
(45) Date of Patent: Feb. 12, 2019

(54) METHOD OF MANUFACTURING PACKAGE ASSEMBLY, PACKAGE ASSEMBLY, AND DISPLAY DEVICE

(71) Applicant: Wuhan China Star Optoelectronics Semiconductor Display Technology Co., Ltd., Wuhan, Hubei (CN)

(72) Inventors: Fenghao Cai, Guangdong (CN); Dong Hwan Kim, Guangdong (CN); Chien Lin Wu, Guangdong (CN); Young Su Kim, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/556,100

(22) PCT Filed: Aug. 18, 2017

(86) PCT No.: PCT/CN2017/097966
§ 371 (c)(1),
(2) Date: Sep. 6, 2017

(65) Prior Publication Data
US 2019/0019985 A1    Jan. 17, 2019

(51) Int. Cl.
*H01L 51/52*    (2006.01)
*H01L 51/56*    (2006.01)
*H01L 51/00*    (2006.01)

(52) U.S. Cl.
CPC ...... *H01L 51/5253* (2013.01); *H01L 51/0097* (2013.01); *H01L 51/56* (2013.01); *H01L 2251/5338* (2013.01)

(58) Field of Classification Search
CPC . H01L 51/5253; H01L 51/56; H01L 51/0097; H01L 2251/5338
USPC .......................................................... 257/40
See application file for complete search history.

(56) References Cited

U.S. PATENT DOCUMENTS 5,661,077 A * 8/1997 Oh ........................ G02B 6/136
257/E25.032
8,853,017 B2 * 10/2014 Nomoto .............. H01L 51/0021
257/E51.007

* cited by examiner

*Primary Examiner* — Monica D Harrison
(74) *Attorney, Agent, or Firm* — Andrew C. Cheng

(57) ABSTRACT

This invention discloses a method of manufacturing a package assembly, a package assembly, and a display device. The method includes: providing a base substrate, provided with a first pattern layer and a second pattern layer located outside the first pattern layer; forming a first cladding layer on the base substrate, the first cladding layer covering a second pattern layer and a region surrounded by the second pattern layer; forming a second cladding layer on the first cladding layer, the second cladding layer covering a top portion of the first pattern layer and a region surrounded by the first pattern layer; forming an organic layer on the first cladding layer and the second cladding layer, the organic layer covering the first pattern layer and a region surrounded by the first pattern layer; and forming a third cladding layer on the organic layer and the first cladding layer.

17 Claims, 2 Drawing Sheets

METHOD OF MANUFACTURING PACKAGE ASSEMBLY, PACKAGE ASSEMBLY, AND DISPLAY DEVICE

TECHNICAL FIELD

This invention relates to the field of display technology, and more particularly to a method of manufacturing a package assembly, a package assembly, and a display device.

DESCRIPTION OF RELATED ART

In recent years, organic light-emitting diode has become very popular emerging flat panel display products at home and abroad. The prior art enables the organic light-emitting diode to be prepared on the flexible substrate, to realize that the flexible display is the important direction of the future display technology development, but the flexible substrate relative to the base substrate for water and oxygen barrier ability is weak. To extend the lifetime of the flexible organic light emitting diode, it is necessary for effective package film on the flexible substrate. Generally, the film package method for organic light-emitting diode is to fabricate an inorganic layer by vapor deposition method, and to fabricate the organic layer by ink-jet printing; then the multilayer inorganic layers and the organic layers are deposited with each other to form a whole film package with excellent performance.

In the long-term development process, the inventors of this application have found that the inorganic layer fabricated by the vapor deposition method and the organic layer fabricated by ink-jet printing have the following drawbacks: when the organic layer is fabricated by ink-jetprinting, the edge flow is not easy to control, so that the organic layer coating accuracy is affected, thus the display effect is affected.

SUMMARY

The main technical problem to be solved by this invention is to provide a method of manufacturing a package assembly, which reduces the flow ability of the edge of the organic layer without affecting the flow ability of the organic layer in the case of covering the region, thereby increasing the printing accuracy at the time of organic printing, and enhance the display effect.

Another technical problem to be solved by this invention is to provide a package assembly, in which the flow ability of the edge of the organic layer is small and the display effect can be improved.

A further technical problem to be solved by this invention is to provide a display device, including a package assembly having a small flow ability at the edge of the organic layer, and the display effect can be improved.

To solve the main technical problems, this invention provides a method of manufacturing a package assembly, including providing a base substrate, provided with a first pattern layer and a second pattern layer located outside the first pattern layer; forming a first cladding layer on the base substrate, the first cladding layer covering the second pattern layer and a region surrounded by the second pattern layer; forming a second cladding layer on the first cladding layer, the second cladding layer covering a top portion of the first pattern layer and a region surrounded by the first pattern layer; forming an organic layer on the second cladding layer and the first cladding layer, the organic layer covering the first pattern layer and a region surrounded by the first pattern layer; and forming a third cladding layer on the organic layer and the first cladding layer, the third cladding layer covering the second pattern layer and a region surrounded by the second pattern layer.

To solve another technical problem, this invention provides a package assembly including a base substrate, provided with a first pattern layer and a second pattern layer located outside the first pattern layer; a first cladding layer, the first cladding layer being formed on the base substrate and covering the second pattern layer and a region surrounded by the second pattern layer; a second cladding layer, the second cladding layer being formed on the first cladding layer and covering a top portion of the first pattern layer and the region surrounded by the first pattern layer; an organic layer, the organic layer formed on the second cladding layer and the first cladding layer and covering the first pattern layer and the region surrounded by the first pattern layer; and a third cladding layer, the third cladding layer being formed on the organic layer and the first cladding layer and covering the second pattern layer and a region surrounded by the second pattern layer.

To solve a further technical problem, this invention provides a display device including a package assembly, including a base substrate, a first cladding layer, a second cladding layer, an organic layer, and a third cladding layer; wherein the base substrate is provided with a first pattern layer and a second pattern layer located outside the first pattern layer; the first cladding layer is formed on the base substrate and covers the second pattern layer and a region surrounded by the second pattern layer, wherein an edge of the first cladding layer is located outside the second pattern layer, an edge of the third cladding layer is located outside the first cladding layer; the second cladding layer is formed on the first cladding layer and covers a top portion of the first pattern layer and a region surrounded by the first pattern layer; the organic layer is formed on the second cladding layer and the first cladding layer and covers the first pattern layer and a region surrounded by the first pattern layer; and the third cladding layer is formed on the organic layer and the first cladding layer and covers the second pattern layer and a region surrounded by the second pattern layer.

The beneficial effect of this invention is that in contrast to the prior art, the contact angle between the organic layer and the first cladding layer is larger than the contact angle between the organic layer and the second cladding layer in this invention, therefore, in the region where flow ability is required, the organic layer is in contact with the second cladding layer, and at the edge of the organic layer, the organic layer is in contact with the first cladding layer to reduce the flow ability of the organic layer edge. By controlling the leveling of materials in different regions at the interface, the printing accuracy of the organic layer is improved and the display effect is enhanced.

BRIEF DESCRIPTION OF THE DRAWINGS

This invention will now be further described with reference to the accompanying drawings and the embodiments, in the accompanying drawings.

DETAILED DESCRIPTION OF EMBODIMENTS

To provide a better understanding of the technical proposal of this invention, a description will be given of a method of manufacturing a package assembly, a package assembly, and a display device in this invention, which will be described in further detail with reference to the accompanying drawings and specific embodiments.

Figure 1:
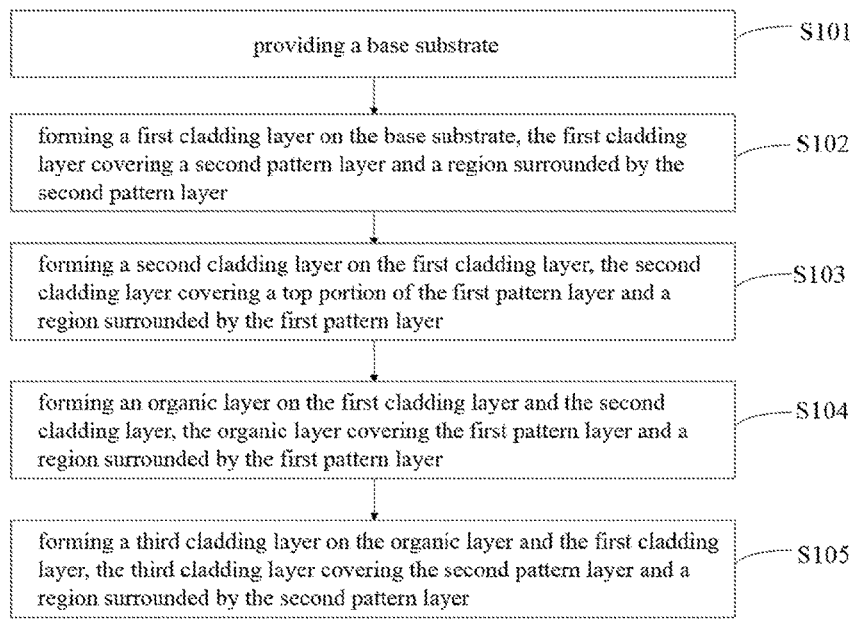
FIG. 1 is a schematic flow diagram of an embodiment of a method of manufacturing a package assembly of this invention.
Figure 2:
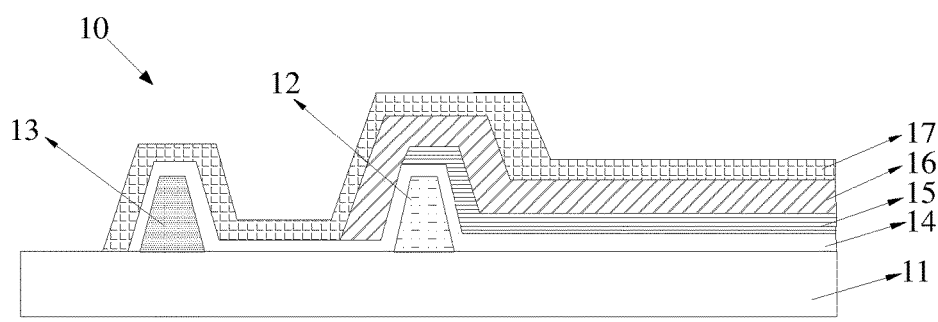
FIG. 2 is a schematic cross-sectional view of an embodiment of the package assembly of this invention.

Referring to FIGS. 1 and 2, FIG. 1 is a schematic flow diagram of an embodiment of a method of manufacturing a package assembly of this invention, and FIG. 2 is a schematic cross-sectional view of an embodiment of a package assembly. In this embodiment, the manufacturing method includes the steps of:

S101: providing a base substrate 11, the base substrate 11 being provided with a first pattern layer 12 and the second pattern layer 13 located outside the first pattern layer 12.

In this embodiment, the first pattern layer 12 and the second pattern layer 13 may be negative photoresist made of epoxy resin. In this embodiment, the first pattern layer 11 and the second pattern layer 12 is formed on the base substrate 11 by lithography process. In other embodiments, the first pattern layer 12 and the second pattern layer 13 may also be negative photoresist made of other materials, such as photosensitive adhesive, ceramic, or acrylic.

S102: forming a first cladding layer 14 on the base substrate 11, and the first cladding layer 14 covering the second pattern layer 13 and the region surrounded by the second pattern layer 13.

The material used for the first cladding layer 14 may be an inorganic material having a strong water-oxygen barrier ability, a small stress and a high visible light transmittance. Specifically, in this embodiment, the material used for the first cladding layer may be one of cuprous oxide, ferric oxide, alumina, titania, zinc selenide, silicon oxide, silicon nitride and silicon oxynitride. In other embodiments, the material used for the first cladding layer 14 may also be acrylic or epoxy.

S103: forming a second cladding layer 15 on the first cladding layer 14, the second cladding layer 15 covering the top portion of the first pattern layer 11 and the region surrounded by the first pattern layer 11.

The material used for the second cladding layer 15 may be an inorganic material having a strong water-oxygen barrier ability, a small stress and a high visible light transmittance. Specifically, in this embodiment, the material used for the second cladding layer 15 may be one of cuprous oxide, ferric oxide, alumina, titania, zinc selenide, silicon oxide, silicon nitride and silicon oxynitride. In other embodiments, the material used for the second cladding layer 14 may also be acrylic or epoxy.

S104: forming an organic layer 16 on the second cladding layer 15 and the first cladding layer 14, the organic layer 16 covering the first pattern layer 14 and the region surrounded by the first pattern layer 15.

The material used in the organic layer 16 may be a polymeric material. Specifically, in this embodiment, the material used for the organic layer 16 may be one of polyethylene terephthalate, polyimide, polycarbonate, epoxy resin, polyethylene and polyacrylate. For example, the organic layer 16 may be formed by polyacrylate.

It is to be noted that in this embodiment, although the first cladding layer 14 and the second cladding layer 15 are all made of an inorganic material, the material of the two cannot be the same. For example, the first cladding layer 14 is a silicon nitride layer, and the second cladding layer 15 is a silicon oxynitride layer, for ensuring that the contact angle between the organic layer 16 and the first cladding layer 14 is larger than the contact angle between the organic layer 16 and the second cladding layer 15.

S105: forming a third cladding layer 17 on the organic layer 16 and the first cladding layer 14, the third cladding layer 17 covering the second pattern layer 13 and the region surrounded by the second pattern layer 13.

The material used for the third cladding layer 17 may be the same as that used for the first cladding layer 14. For example, the first cladding layer 14 and the third cladding layer 17 are silicon nitride layers.

The method of manufacturing the package assembly in this embodiment includes providing a base substrate 11, the base substrate 11 being provided with the first pattern layer 12 and the second pattern layer 13 located outside the first pattern layer 12; forming the first cladding layer 14 on the base substrate, the first cladding layer 14 covering the second pattern layer 13 and the region surrounded by the second pattern layer 13; forming the second cladding layer 15 on the first cladding layer 14, the second cladding layer 15 covering the top portion of the first pattern layer 12 and the region surrounded by the first pattern layer 12; forming the organic layer 16 on the second cladding layer 15 and the first cladding layer 14, the organic layer 16 covering the first pattern layer 12 and the region surrounded by the first pattern layer 12; forming the third cladding layer 17 on the organic layer 16 and the first cladding layer 14, the third cladding layer 17 covering the second pattern layer 13 and the region surrounding by the second pattern layer 13. In the manufacturing method of this embodiment, by controlling the contact angle between the organic layer 16 and the first cladding layer 14 to be larger than the contact angle between the organic layer 16 and the second cladding layer 14, there by the printing accuracy at the time of printing the organic layer 16 is improved and the display effect is improved.

In this embodiment, the first cladding layer 14, the second cladding layer 15, and the third cladding layer 17 may be formed by a plasma enhanced chemical vapor deposition method.

In this embodiment, the organic layer 16 may be formed by ink-jet printing. In other embodiments, the printing method of the organic layer 16 may be one of plasma enhanced chemical vapor deposition method, letterpress printing, ink-jet printing, vapor deposition and the like.

In this embodiment, the first pattern layer and the second pattern layer may be an organic layer made of a photosensitive adhesive and having a trapezoidal cross section. For example, the first pattern layer 12 and the second pattern layer 13 may be dams made of photosensitive adhesive.

Figure 3:
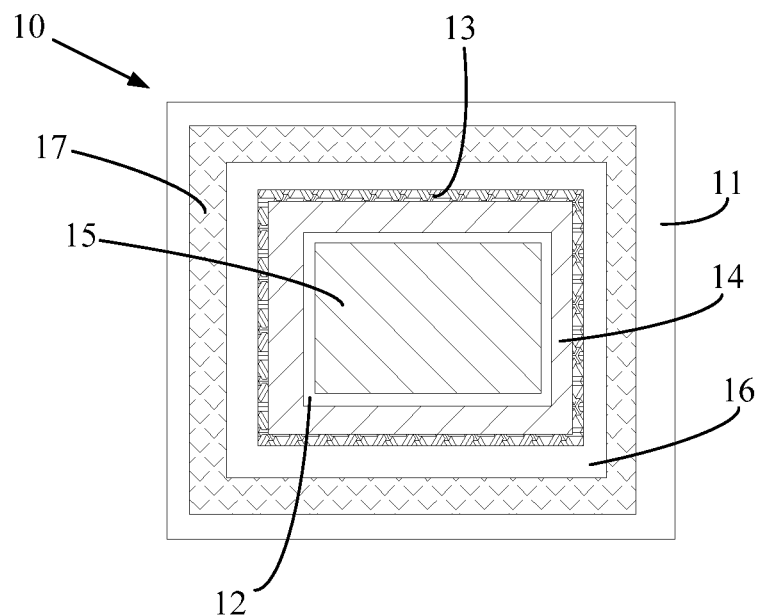
FIG. 3 is a top view of the package assembly of FIG. 2.

Referring to FIGS. 2 and 3, FIG. 3 is a top view of the package assembly of FIG. 2. In this embodiment, the package assembly 10 includes the base substrate 11, the first pattern layer 11, the second pattern layer 12, the second pattern layer 13, the first cladding layer 14, the second cladding layer 15, the organic layer 16, and the third cladding layer 17.

Specifically, the base substrate 11 is provided with the first pattern layer 12 and the second pattern layer 13 located outside the first pattern layer 12.

The base substrate 11 is generally a glass substrate, and a flexible plastic substrate or a metal substrate may be used when fabricating a flexible OLED panel.

The first cladding layer 14 is formed on the base substrate 11 and covers the second pattern layer 13 and the region surrounded by the second pattern layer 13.

The second cladding layer 15 is formed on the first cladding layer 14, and covers the top portion of the first pattern layer 12 and the region surrounded by the first pattern layer 12.

The organic layer 16 is formed on the second cladding layer 15 and the first cladding layer 14 and covers the first pattern layer 12 and the region surrounded by the first pattern layer 12.

The third cladding layer 17 is formed on the organic layer 16 and the first cladding layer 15 and covers the second pattern layer 13 and the region surrounded by the second pattern layer 13.

The details of the package assembly 10 are described in the embodiments of the method of manufacturing the package assembly described above, and will not be described here.

In this embodiment, the package assembly 10 includes the base substrate 11, the base substrate 11 being provided with the first pattern layer and the second pattern layer 13 located outside the first pattern layer 12; the first cladding layer 14, the first cladding layer 14 being formed on the base substrate 11 and covering the second pattern layer 13 and the region of surrounded by the second pattern layer 13; the second cladding layer 15, the second cladding layer 15 being formed on the first cladding layer 14 and covering the top portion of the first pattern layer 12 and the region surrounded by the first pattern layer 12; the organic layer 16, the organic layer 16 being formed on the second cladding layer 15 and the first cladding layer 14 and covering the first pattern layer 12 and the region surrounded by the first pattern layer 12; the third cladding layer 17, the third cladding layer 17 being formed on the organic layer 16 and the first cladding layer 15 and covering the second pattern layer 13 and the region surrounded by the second pattern layer 13. This invention controls the contact angle of the organic layer by controlling the roughness of the cladding layer material by using the principle that the liquid flow is easier when the contact angle of the liquid on the solid is smaller. In the package assembly 10 of this embodiment, by controlling the contact angle between the organic layer 16 and the first cladding layer 14 to be larger than the contact angle between the organic layer 16 and the second cladding layer 14, the printing accuracy of the organic layer 16 is improved and the display effect is enhanced.

In this embodiment, the edge of the first cladding layer 14 is located outside the second pattern layer 13, and the edge of the third cladding layer 17 is located outside the first cladding layer 14.

In this embodiment, the first pattern layer 12 and the second pattern layer 13 may be an organic layer made of photosensitive adhesive and having a trapezoidal cross section. For example, the first pattern layer 12 and the second pattern layer 13 may be dams made of photosensitive adhesive.

In this embodiment, the first cladding layer 14, the second cladding layer 15, and the third cladding layer 17 may be formed by a plasma enhanced chemical vapor deposition method.

In this embodiment, the organic layer 16 may be formed by ink-jet printing.

Figure 4:
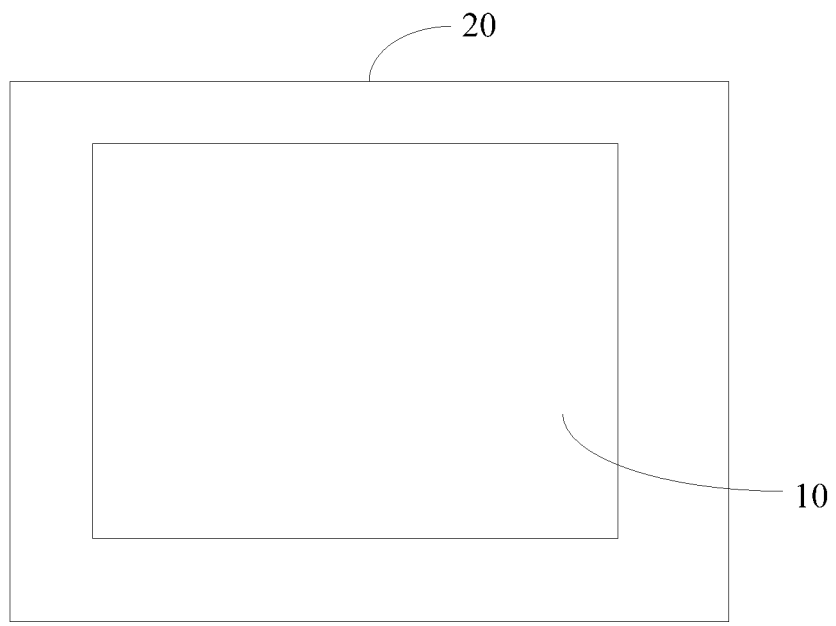
FIG. 4 is a schematic structural view of an embodiment of a display device of this invention.

Referring to FIG. 4, FIG. 4 is a schematic structural view of an embodiment of the display device of this invention. The display device 20 of this invention includes the package assembly 10. The details of the package assembly 10 are described in the embodiments of the method of manufacturing the package assembly and the embodiments of the package assembly, which will not be described here.

The display device in this embodiment includes the package assembly, and the display device of this embodiment improves the display effect by improving the printing accuracy at the time of printing the organic layer of the package assembly.

Above are only embodiments of this invention is not patented and therefore limit the scope of this invention, the use of any content of this specification and drawings made equivalent or equivalent structural transformation process, either directly or indirectly related to the use of other technologies regions are included in the same way the scope of the patent protection of this invention.

What is claimed is:

1. A method of manufacturing a package assembly, the method comprising:
   providing a base substrate, on which a first pattern layer and a second pattern layer are sequentially deposited, wherein the second pattern layer is located outside the first pattern layer;
   forming a first cladding layer on the base substrate, the first cladding layer covering the second pattern layer and a region surrounded by the second pattern layer;
   forming a second cladding layer on the first cladding layer, the second cladding layer covering a top portion of the first pattern layer and a region surrounded by the first pattern layer;
   forming an organic layer on the second cladding layer and the first cladding layer, the organic layer covering the first pattern layer and the region surrounded by the first pattern layer; and
   forming a third cladding layer on the organic layer and the first cladding layer, the third cladding layer covering the second pattern layer and the region surrounded by the second pattern layer.

2. The method of manufacturing the package assembly according to claim 1, wherein the first cladding layer, the second cladding layer, and the third cladding layer are formed by a plasma enhanced chemical vapor deposition method.

3. The method of manufacturing the package assembly according to claim 1, wherein the organic layer is formed by ink-jet printing.

4. The method of manufacturing the package assembly according to claim 1, wherein the first pattern layer and the second pattern layer are organic layers made of a photosensitive adhesive and having a trapezoidal cross section.

5. The method of manufacturing the package assembly according to claim 1, wherein the step of providing the base substrate, provided with the first pattern layer and the second pattern layer located outside the first pattern layer, specifically comprises:
   using lithography process to form the first pattern layer and the second pattern layer on the base substrate.

6. The method of manufacturing the package assembly according to claim 1, wherein materials of the first cladding layer and the second cladding layer are different.

7. A package assembly, comprising:
   a base substrate, provided with a first pattern layer and a second pattern layer located outside the first pattern layer;
   a first cladding layer, formed on the base substrate and covering the second pattern layer and a region surrounded by the second pattern layer;

a second cladding layer, formed on the first cladding layer and covering a top portion of the first pattern layer and a region surrounded by the first pattern layer;

an organic layer, formed on the second cladding layer and the first cladding layer, and covering the first pattern layer and the region surrounded by the first pattern layer; and a third cladding layer, formed on the organic layer and the first cladding layer, and covering the second pattern layer and the region surrounded by the second pattern layer.

8. The package assembly according to claim 7, wherein an edge of the first cladding layer is located outside the second pattern layer and an edge of the third cladding layer is located outside the first cladding layer.

9. The package assembly according to claim 7, wherein the first pattern layer and the second pattern layer are organic layers made of a photosensitive adhesive and having a trapezoidal cross section.

10. The package assembly according to claim 7, wherein the first pattern layer and/or first pattern layer is an organic layer made of ceramic or acrylic.

11. The package assembly according to claim 7, wherein the first cladding layer, the second cladding layer, and the third cladding layer are formed by a plasma enhanced chemical vapor deposition method.

12. The package assembly according to claim 7, wherein the organic layer is formed by ink-jet printing.

13. A display device, comprising:
a package assembly, comprising a base substrate, a first cladding layer, a second cladding layer, an organic layer, and a third cladding layer;
wherein the base substrate is provided with a first pattern layer and a second pattern layer located outside the first pattern layer;

the first cladding layer is formed on the base substrate, and covers the second pattern layer and a region surrounded by the second pattern layer, wherein an edge of the first cladding layer is located outside the second pattern layer, an edge of the third cladding layer is located outside the first cladding layer;

the second cladding layer is formed on the first cladding layer, and covers a top portion of the first pattern layer and a region surrounded by the first pattern layer;

the organic layer is formed on the second cladding layer and the first cladding layer, and covers the first pattern layer and the region surrounded by the first pattern layer; and the third cladding layer is formed on the organic layer and the first cladding layer, and covers the second pattern layer and the region surrounded by the second pattern layer.

14. The display device according to claim 13, wherein the first cladding layer, the second cladding layer, and the third cladding layer are formed by a plasma enhanced chemical vapor deposition method.

15. The display device according to claim 13, wherein the organic layer is formed by ink-jet printing.

16. The display device according to claim 13, wherein the first pattern layer and the second pattern layer are organic layers made of a photosensitive adhesive and having a trapezoidal cross section.

17. The package assembly according to claim 13, wherein the first pattern layer and/or the first pattern layer is an organic layer made of ceramic or acrylic.

* * * * *